US010332941B2

(12) United States Patent
Bae et al.

(10) Patent No.: US 10,332,941 B2
(45) Date of Patent: Jun. 25, 2019

(54) FLEXIBLE DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: In Jun Bae, Yongin-si (KR); Ji Hye Park, Yongin-si (KR); Jae Hwan Oh, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/447,936

(22) Filed: Mar. 2, 2017

(65) Prior Publication Data

US 2017/0256594 A1 Sep. 7, 2017

(30) Foreign Application Priority Data

Mar. 4, 2016 (KR) ........................ 10-2016-0026207

(51) Int. Cl.
*H01L 29/08* (2006.01)
*H01L 35/24* (2006.01)
(Continued)

(52) U.S. Cl.
CPC ........ *H01L 27/323* (2013.01); *H01L 27/3258* (2013.01); *H01L 27/3262* (2013.01);
(Continued)

(58) Field of Classification Search
CPC ... H01L 27/323; H01L 51/56; H01L 51/5246; H01L 51/0097; H01L 27/3262; H01L 27/3258; H01L 51/003
See application file for complete search history.

(56) References Cited

U.S. PATENT DOCUMENTS 9,095,016 B2    7/2015   Kwack et al.
9,367,162 B2    6/2016   Lee
(Continued)

FOREIGN PATENT DOCUMENTS

KR    10-1453880    10/2014

OTHER PUBLICATIONS

M. Diskus, Growth of Thin Films of Molybdenum Oxide by Atomic Layer Deposition, Journal of Materials Chemistry, 2011, 21, 705-710.
(Continued)

*Primary Examiner* — Ismail A Muse
(74) *Attorney, Agent, or Firm* — Lee & Morse, P.C.

(57) ABSTRACT

A method of manufacturing a flexible display device includes forming a base substrate on a first sacrificial layer formed on a first supporting substrate, forming a display device array on the base substrate, forming a second sacrificial layer on a second supporting substrate, forming a touch array on the second sacrificial layer, adhering the first supporting substrate onto the second supporting substrate using an adhesive, irradiating laser energy onto the first sacrificial layer to remove the first sacrificial layer and separate the first supporting substrate from the base substrate, and irradiating laser energy onto the second sacrificial layer to separate interfaces of the second supporting substrate and the second sacrificial layer from each other, such that the second sacrificial layer is fixed on the touch array, The second sacrificial layer includes at least one of oxidized molybdenum, lead zirconate titanate, gallium nitride, and an amorphous silicon based inorganic material.

7 Claims, 6 Drawing Sheets

(51) Int. Cl.
   *H01L 51/00* (2006.01)
   *H01L 27/32* (2006.01)
   *H01L 51/52* (2006.01)
   *H01L 51/56* (2006.01)
(52) U.S. Cl.
   CPC ........ *H01L 51/003* (2013.01); *H01L 51/0097* (2013.01); *H01L 51/52* (2013.01); *H01L 51/5246* (2013.01); *H01L 51/56* (2013.01); *Y02E 10/549* (2013.01); *Y02P 70/521* (2015.11)

(56) References Cited

U.S. PATENT DOCUMENTS

| | | | | |
|---|---|---|---|---|
| 2011/0140076 | A1* | 6/2011 | Song | H01L 33/0079 257/13 |
| 2012/0326139 | A1* | 12/2012 | Chen | H01L 51/0005 257/40 |
| 2015/0221754 | A1* | 8/2015 | Hondo | H01L 29/78693 438/104 |
| 2016/0099428 | A1* | 4/2016 | Lee | H01L 51/56 257/40 |
| 2016/0252660 | A1* | 9/2016 | Matsuno | G02B 5/3033 359/487.02 |
| 2017/0062744 | A1* | 3/2017 | Jesper | C07D 455/04 |
| 2017/0069692 | A1* | 3/2017 | Lee | H01L 27/323 |
| 2018/0047772 | A1* | 2/2018 | Wang | H01L 27/14618 |

OTHER PUBLICATIONS

Seung Jae Baik, Towards a High Efficiency Amorphous Silicon Solar Cell Using Molybdenum Oxide as a Window Layer Instead of Conventional P-Type . . . , Applied Physics Letters 99, Aug. 2011.

M. Diskus, Dissertation, MOO3 Synthesis by ALD and Characterization of the Films, University of Oslo, Norway, Sep. 2011, pp. 29-32.

Seungjun Kim et al., Flexible Crossbar-Structured Resistive Memory Arrays on Plastic Substrates Via Inorganic-Based Laser Lift-Off, Advanced Materials, 2014, 26, 7480-7487.

* cited by examiner

FLEXIBLE DISPLAY DEVICE AND METHOD OF MANUFACTURING THE SAME

CROSS-REFERENCE TO RELATED APPLICATION

Korean Patent Application No. 10-2016-0026207, filed on Mar. 4, 2016, in the Korean Intellectual Property Office, and entitled: "Flexible Display Device and Method of Manufacturing the Same," is incorporated by reference herein in its entirety.

BACKGROUND

1. Field

Embodiments relate to a flexible display device and a method of manufacturing the same.

2. Description of the Related Art

A foldable or bendable flexible display device may have improved portability. In the flexible display device, a flexible substrate with improved flexibility is used. The flexible substrate may be formed of plastic or resin.

SUMMARY

Embodiments are directed to a method of manufacturing a flexible display device including forming a base substrate on a first sacrificial layer formed on a first supporting substrate, forming a display device array on the base substrate, forming a second sacrificial layer on a second supporting substrate, forming a touch array on the second sacrificial layer, adhering the first supporting substrate onto the second supporting substrate using an adhesive, irradiating laser energy onto the first sacrificial layer to remove the first sacrificial layer and to separate the first supporting substrate from the base substrate, and irradiating laser energy onto the second sacrificial layer to separate interfaces of the second supporting substrate and the second sacrificial layer from each other and such that the second sacrificial layer is fixed on the touch array. The second sacrificial layer includes at least one selected from the group of oxidized molybdenum ($MoO_3$), lead zirconate titanate (PZT), gallium nitride (GaN), and an amorphous silicon (a-Si) based inorganic material.

The second sacrificial layer may be formed on the second supporting substrate by an atomic layer deposition (ALD) method or a chemical vapor deposition (CVD) method.

A thickness of the second sacrificial layer may be 1,000 Å through 3,000 Å.

The method may further include coating a protective layer onto the second sacrificial layer.

Coating the protective layer onto the second sacrificial layer may be performed by an inkjet method.

The first sacrificial layer and the second sacrificial layer may include different materials.

The base substrate may include one selected from the group of polyethylene naphthalate (PEN), polyethylene terephthalate (PET), polyethylene etherphthalate, polycarbonate, polyarylate, polyetherimide, polyether sulfonate, polyimide, and polyacrylate.

Forming the display device array may include forming a thin film transistor (TFT) on the base substrate, forming a first electrode on the TFT, forming an organic light emitting layer on the first electrode, and forming a second electrode on the organic light emitting layer.

Embodiments are also directed to a flexible display device including a base substrate, a display device array on a first surface of the base substrate, a first barrier layer on the display device array, a touch array on the first barrier layer, an adhesive between the first barrier layer and the touch array, and a sacrificial layer on the touch array. The sacrificial layer may include at least one selected from the group of oxidized molybdenum ($MoO_3$), lead zirconate titanate (PZT), gallium nitride (GaN), and an amorphous silicon (a-Si) based inorganic material.

The touch array may include a first touch electrode that extends in a first direction and a second touch electrode that extends in a second direction that intersects the first direction.

The display device array may include a TFT on the base substrate, a first electrode on the TFT, an organic light emitting layer on the first electrode, and a second electrode on the organic light emitting layer.

The first barrier layer may include a first organic layer on the second electrode, a first inorganic layer on the first organic layer, a second organic layer on the first inorganic layer, and a second inorganic layer between the second organic layer and the adhesive.

The flexible display device may further include a third organic layer on the sacrificial layer.

A thickness of the sacrificial layer may be 1,000 Å through 3,000 Å.

The flexible display device may further include a second barrier layer under the base substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
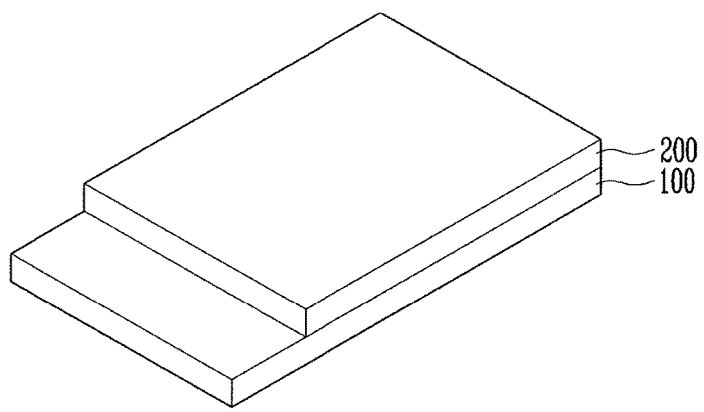
FIG. 1 illustrates a perspective view of a flexible display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an embodiment will be described with reference to the accompanying drawings.

Figure 2:
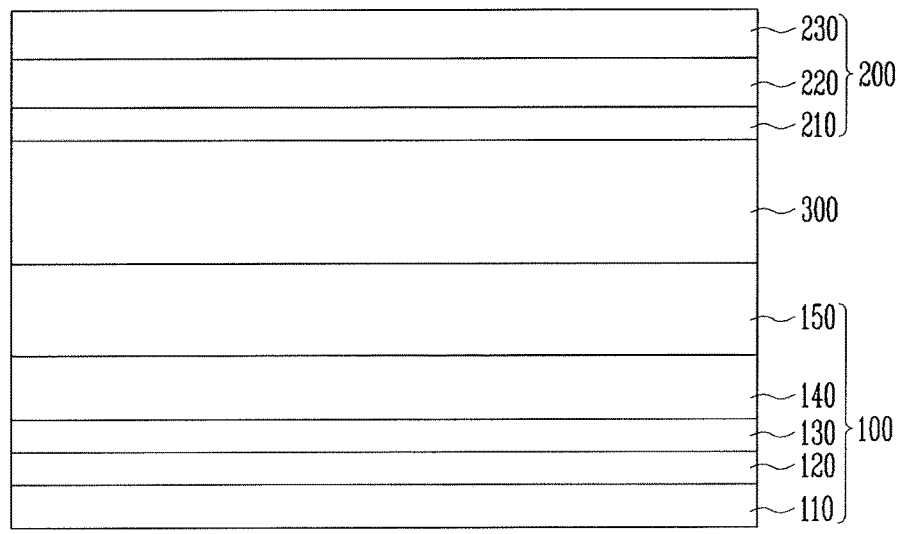
FIG. 2 illustrates a cross-sectional view of the flexible display device of FIG. 1.
Figure 3:
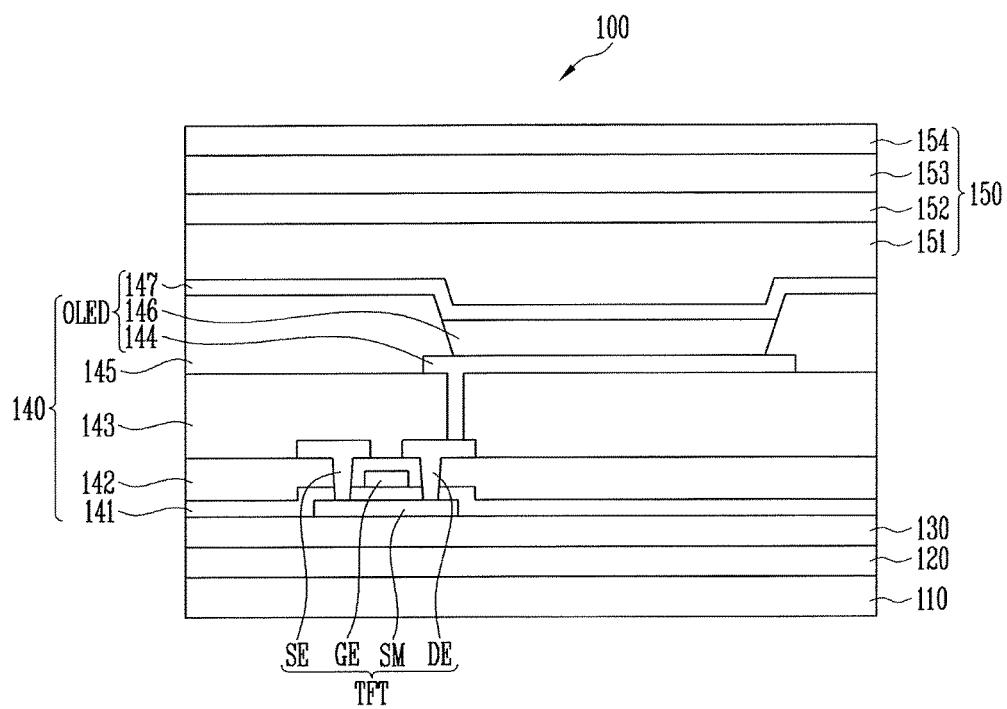
FIG. 3 illustrates a cross-sectional view of the display unit of FIG. 2.
Figure 4:
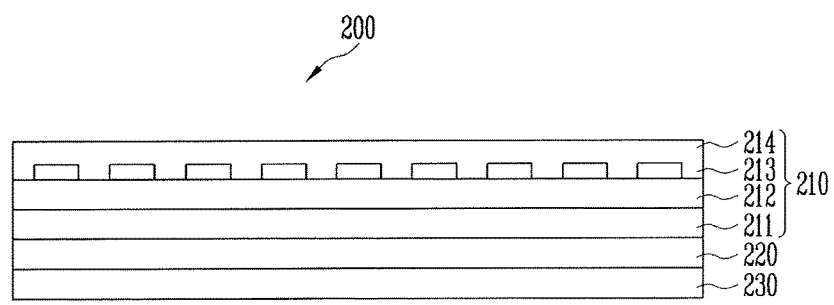
FIG. 4 illustrates a cross-sectional view of the touch unit of FIG. 2.

FIG. 1 illustrates a perspective view of a flexible display device according to an embodiment. FIG. 2 illustrates a cross-sectional view of the flexible display device of FIG. 1. FIG. 3 illustrates a cross-sectional view of the display unit of FIG. 2. FIG. 4 illustrates a cross-sectional view illustrating the touch unit of FIG. 2.

Referring to FIGS. 1 through 4, the flexible display device according to the embodiment may be a rectangular plate having two pairs of sides that run parallel with each other. When the flexible display device is the rectangular plate, one pair of sides of the two pairs of sides may be longer than the other pair of sides.

The flexible display device may include a display unit 100 for displaying an image and a touch unit 200 for recognizing a touch.

The display unit 100 may display arbitrary visual information, for example, a text, a video, a picture, or a two-dimensional or three-dimensional image. Hereinafter, the displayed arbitrary visual information is referred to as "an image". A kind of the display unit 100 as displaying the image is not limited thereto.

The display unit 100 may include a base substrate 120, a display device array 140 disposed on the base substrate 120, and a first barrier layer 150 disposed on the display device array 140.

The base substrate 120 may be a plastic film formed of at least one organic material selected from polyethylene naphthalate (PEN), polyethylene terephthalate (PET), polyethylene etherphthalate, polycarbonate, polyarylate, polyetherimide, polyether sulfonate, polyimide, and polyacrylate.

A buffer layer 130 may be disposed between the base substrate 120 and the display device array 140. The buffer layer 130 may improve adhesion between the display device array 140 and the base substrate 120 and may help to prevent moisture or impurities generated by the base substrate 120 from being diffused into the display device array 140. The buffer layer 130 may be formed of a single layer of an inorganic insulating material such as oxide silicon (SiOx) and nitride silicon (SiNx) or a double layer of oxide silicon (SiOx) and nitride silicon (SiNx).

A second barrier layer 110 may be disposed on a surface of the base substrate 120 opposite to a surface on which the display device array 140 is arranged. The second barrier layer 110 may help to prevent oxygen and moisture from being received from the outside to a rear surface of the base substrate 120. The second barrier layer 110 may be a film formed by coating an inorganic material as a single layer or as a multilayer on an organic material such that flexibility of the base substrate 120 may be secured.

The display device array 140 may be disposed on the base substrate 120 with the buffer layer 130 interposed.

As illustrated in FIG. 3, the display device array 140 may include a thin film transistor (TFT) and an organic light emitting diode (OLED) electrically connected to the TFT.

For example, the TFT may include a semiconductor layer SM disposed on the buffer layer 130, a gate electrode GE disposed on the semiconductor layer SM, and a source electrode SE and a drain electrode DE disposed on the gate electrode GE.

The semiconductor layer SM may be disposed on the buffer layer 130. The semiconductor layer SM may include one of amorphous silicon (a-Si), polycrystalline silicon (p-Si), and oxide semiconductor. The semiconductor layer SM may include a source region formed by doping or injecting impurities into a region that contacts the source electrode SE and a drain region formed by doping or injecting impurities into a region that contacts the drain electrode DE. A region between the source region and the drain region may be a channel region.

A first insulating layer 141 may be disposed on the semiconductor layer SM. The first insulating layer 141 may cover the semiconductor layer SM and may insulate the semiconductor layer SM and the gate electrode GE from each other.

The gate electrode GE may be disposed on the first insulating layer 141 to overlap the semiconductor layer SM. The gate electrode GE may include at least one among aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy of Ag, W, Cu, Ni, Cr, Mo, Ti, Pt, Ta, Nd, and Sc.

A second insulating layer 142 may be disposed on the gate electrode GE. The second insulating layer 142 may insulate the gate electrode GE and the source and drain electrodes SE and DE from each other.

The source electrode SE and the drain electrode DE may be disposed on the second insulating layer 142, spaced apart from each other by a uniform distance. The source electrode SE may contact the source region of the semiconductor layer SM and the drain electrode DE may contact the drain region of the semiconductor layer SM.

According to the current embodiment, the TFT is illustrated as having a top gate structure. In some implementations, the TFT may have a bottom gate structure.

A third insulating layer 143 may be disposed on the source electrode SE and the drain electrode DE. A portion of the third insulating layer 143 may be removed such that a portion of the drain electrode DE is exposed to the outside. The third insulating layer 143 may be an organic protective layer. The organic protective layer may include one of acryl, polyimide (PI), polyamide (PA), and benzocyclobutene (BCB). The organic protective layer may be a transparent and flexible planarizing layer capable of reducing a curve of an understructure and planarizing the understructure.

The OLED may be disposed on the third insulating layer 143 and may be electrically connected to the drain electrode DE.

The OLED may be one of a rear emission type OLED, a front emission type OLED, and a double-side emission type OLED in accordance with an emission type. According to the current embodiment, for convenience sake, the OLED is illustrated as being the rear emission type OLED.

The OLED includes a first electrode 144 that is a transmissive electrode capable of transmitting light, an organic light emitting layer 146 disposed on the first electrode 144, and a second electrode 147 that is disposed on the organic light emitting layer 146. The second electrode 147 may be a reflective electrode capable of reflecting light.

The first electrode 144 may be connected to the drain electrode DE. The first electrode 144 may be a conductive layer including a transparent conductive oxide such as an indium tin oxide (ITO), an indium zinc oxide (IZO), an aluminum zinc oxide (AZO), a gallium doped zinc oxide (GZO), a zinc tin oxide (ZTO), a gallium tin oxide (GTO), or a fluorine doped tin oxide (FTO). A pixel defining layer 145 may be arranged on the first electrode 144.

The pixel defining layer 145 may include an opening that exposes a part of the first electrode 144. The pixel defining layer 145 may include an organic insulating material. The organic light emitting layer 146 may be arranged on the first electrode 144 exposed by the pixel defining layer 145.

The organic light emitting layer 146 may include at least a light emitting layer. In some implementations, the organic light emitting layer 146 may have a multilayer thin film structure. The second electrode 147 may be arranged on the organic light emitting layer 146.

The second electrode 147 may include a material having a lower work function than the first electrode 144, for example, at least one among Mo, W, Ag, magnesium (Mg), Al, Pt, palladium (Pd), gold (Au), Ni, Nd, iridium (Ir), Cr, calcium (Ca), and an alloy of Mo, W, Ag, Mg, Al, Pt, Pd, Au, Ni, Nd, Ir, Cr, and Ca.

The first barrier layer 150 may be disposed on the display device array 140. The first barrier layer 150 may have such a structure so as to cover the display device array 140.

The first barrier layer 150 may include first and second organic layers 151 and 153 and first and second inorganic layers 152 and 154. The first and second organic layers 151 and 153 and the first and second inorganic layers 152 and 154 may be alternately laminated. For example, the first organic layer 151 may be disposed on the OLED, the first inorganic layer 152 is disposed on the first organic layer 151, the second organic layer 153 is disposed on the first inorganic layer 152, and the second inorganic layer 154 may be disposed on the second organic layer 153.

The first and second organic layers 151 and 153 may be formed of a high molecular organic compound. For example, the first and second organic layers 151 and 153 may include one of epoxy, acrylate, and urethaneacrylate. The first and second organic layers 151 and 153 may supplement a defect of the first and second inorganic layers 152 and 154 and may planarize the first and second inorganic layers 152 and 154.

The first and second inorganic layers 152 and 154 may be formed of a metal oxide, a metal nitride, a metal carbide, or a combination of the metal oxide, the metal nitride, and the metal carbide. For example, the first and second inorganic layers 152 and 154 may be formed of an aluminum oxide, a silicon oxide, or a silicon nitride. As another example, the first and second inorganic layers 152 and 154 may include a lamination structure of a plurality of inorganic insulating layers. The first and second inorganic layers 152 and 154 may help to prevent external moisture and/or oxygen from permeating into the OLED.

The touch unit 200 may adhere to the first barrier layer 150 having such a structure through an adhesive 300 to face the first barrier layer 150.

As illustrated in FIG. 4, the touch unit 200 may include a sacrificial layer 220 and a touch array 210 disposed on the sacrificial layer 220. For convenience sake, the touch array 210 is described first herein, and then, the sacrificial layer 220 is described.

The touch array 210 may include a first touch electrode 211 and a second touch electrode 213 that are disposed on the sacrificial layer 220. The first touch electrode 211 and the second touch electrode 213 may intersect each other with a first touch array insulating layer 212 interposed therebetween. A second touch array insulating layer 214 may be formed to cover the second touch electrode 213. The touch array 210 may be driven by a mutual capacitance method in which a change in capacitance caused by an interaction between the first touch electrode 211 and the second touch electrode 213 is sensed.

Materials, shapes, and arrangement structures of the first touch electrode 211 and the second touch electrode 213 may have various modifications in accordance with a touch sensing type of the flexible display device. For example, the first touch electrode 211 may be formed of a plurality of sensing electrode rows connected in one direction and parallel with each other. The second touch electrode 213 may be formed of a plurality of sensing electrode columns intersecting the plurality of sensing electrode rows and parallel with each other. The first touch electrode 211 and the second touch electrode 213 may be disposed in different layers as illustrated in the drawing. In some implementations, the first touch electrode 211 and the second touch electrode 213 may be disposed in the same layer.

The plurality of sensing electrode rows provided in the first touch electrode 211 or the plurality of sensing electrodes columns provided in the second touch electrode 213 may be spaced apart from each other and may be connected through a bridge.

The sacrificial layer 220 may be disposed under the first touch electrode 211. The first sacrificial layer 220 may include at least one inorganic material such as oxidized molybdenum ($MoO_3$), lead zirconate titanate (PZT), gallium nitride (GaN), or an amorphous silicon (a-Si) based material.

The sacrificial layer 220 may be formed, for example, by an atomic layer deposition (ALD) method or a chemical vapor deposition (CVD) method.

The touch unit 200 may further include a third organic layer 230 disposed under the sacrificial layer 220. The third organic layer 230 may be disposed on the sacrificial layer 220 after the touch unit 200 is adhered to the display unit 100. The third organic layer 230 may help to prevent oxygen and moisture from being received from the outside to the sacrificial layer 220. The third organic layer 230 may be coated onto a rear surface of the sacrificial layer 220 by an inkjet method.

A structure of a flexible display device according to an embodiment is described above. Hereinafter, a method of manufacturing a flexible display device according to an embodiment will be described.

FIGS. 5 through 12 illustrate cross-sectional views depicting stages of a method of manufacturing a flexible display device according to an embodiment.

Figure 5:
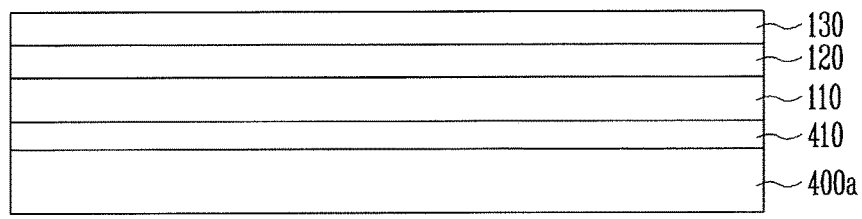
FIGS. 5 through 12 illustrate cross-sectional views of stages of a method of manufacturing a flexible display device according to an embodiment.

Referring to FIG. 5, a first sacrificial layer 410 is disposed on a first supporting substrate 400*a* formed of glass. A base substrate 120 is disposed on the first sacrificial layer 410.

The first sacrificial layer 410 may fix the first supporting substrate 400*a* and the base substrate 120. The first sacrificial layer 410 may include a material that is capable of being easily stripped by laser in a subsequent stripping process.

The base substrate 120 may be a plastic film formed by coating a polymer solution onto the first sacrificial layer 410 by a slit coating method or a spin coating method and hardening the polymer solution. The plastic film may be formed of at least one organic material selected from polyethylene naphthalate (PEN), polyethylene terephthalate (PET), polyethylene etherphthalate, polycarbonate, polyarylate, polyetherimide, polyether sulfonate, polyimide, and polyacrylate.

The buffer layer 130 may be disposed on the base substrate 120. The buffer layer 130 may improve adhesion between the display device array 140 formed by a subsequent process and the base substrate 120 and may prevent moisture or impurities generated by the base substrate 120 from being diffused into the display device array 140.

The second barrier layer 110 may be disposed on the rear surface of the base substrate 120. The second barrier layer 110 may be disposed between the base substrate 120 and the first sacrificial layer 410. The second barrier layer 110 may prevent impurities from being received to the rear surface of the base substrate 120 when the base substrate 120 is stripped from the first supporting substrate 400a by a subsequent stripping process.

Figure 6:
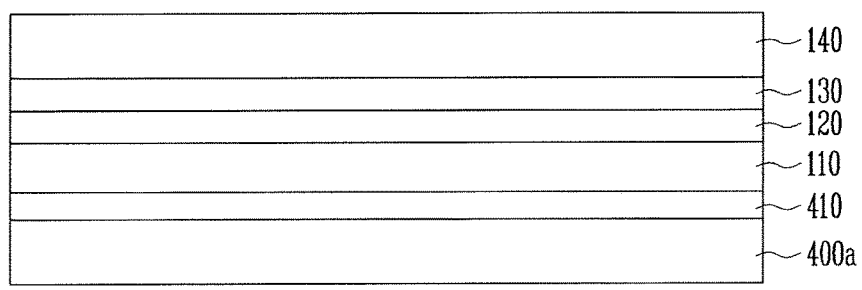

Referring to FIG. 6, the display device array 140 is disposed on the buffer layer 130. The display device array 140 may include a thin film transistor (TFT) including a semiconductor layer, a gate electrode, a source electrode, and a drain electrode and an OLED electrically connected to the TFT.

The semiconductor layer may be disposed on the buffer layer 130 and a first insulating layer is disposed on the semiconductor layer. Then, the gate electrode may be disposed on the first insulating layer to overlap a channel region of the semiconductor layer and a second insulating layer is disposed on the gate electrode. Then, the source electrode and the drain electrode, spaced apart from each other by a uniform distance, may be formed on the second insulating layer.

A third insulating layer may be disposed on the TFT to cover the TFT. The third insulating layer may planarize the base substrate 120 on which the TFT is provided. A first electrode may be disposed on the third insulating layer. A pixel defining layer that exposes a part of the first electrode may be provided. An organic light emitting layer may be disposed on the exposed first electrode. A second electrode is disposed on the organic light emitting layer.

Figure 7:
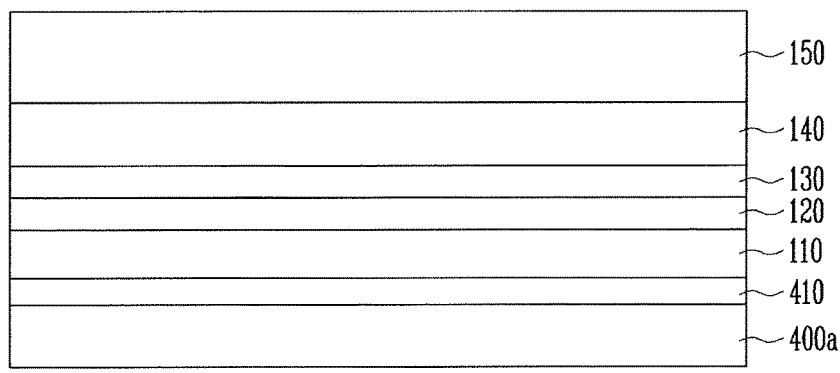

Referring to FIG. 7, the first barrier layer 150 may be disposed on the display device array 140. The first barrier layer 150 may include a plurality of organic layers and a plurality of inorganic layers.

Figure 8:
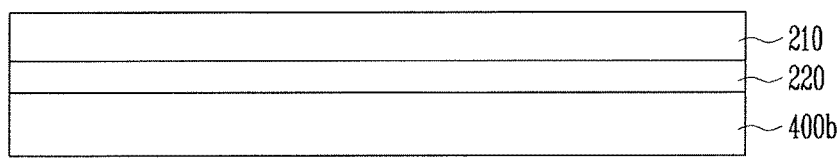

Referring to FIG. 8, a second sacrificial layer 220 may be disposed on a second supporting substrate 400b formed of glass. The touch array 210 may be disposed on the second sacrificial layer 220. The second sacrificial layer 220 may be the same as the sacrificial layer 220 illustrated in FIG. 2. For convenience sake, in discussing the method of manufacturing a flexible display device, the sacrificial layer 220 is referred to as the "second sacrificial layer" to distinguish from the first sacrificial layer 410, which is used in the method of manufacturing the flexible display device, but is not present in the manufactured flexible display device.

The second supporting substrate 400b may have a larger energy band value than an energy band gap of a laser such that a transmittance of laser energy irradiated onto the second supporting substrate 400b may be high in a laser lift off (LLO) process described below.

The second sacrificial layer 220 may include a material different from the first sacrificial layer (410 of FIG. 7). For example, the second sacrificial layer 220 may include at least one among $MoO_3$, PZT, GaN, and an a-Si based inorganic material.

The second sacrificial layer 220 may be formed on the second supporting substrate 400b by an ALD method or a CVD method.

For example, when the second sacrificial layer 220 includes a thin film formed of a $MoO_3$ based inorganic material, the second sacrificial layer 220 may be formed on the second supporting substrate 400b by the ALD method using $Mo(CO)_6$, ozone, or water as a precursor.

In some implementations, when the second sacrificial layer 220 includes the thin film formed of the $MoO_3$ based inorganic material, the second sacrificial layer 220 may be formed on the second supporting substrate 400b by a CVD method using $Mo(CO)_6$ as the precursor and in which a mixed gas of Ar and $O_2$ is used.

The thickness of the sacrificial layer 220 may vary in accordance with the kind of material used. The second sacrificial layer 220 may have a thickness of, for example, about 1,000 Å through 3,000 Å. In some implementations, the second sacrificial layer 220 may have a thickness no less than 2,000 Å, such that the second sacrificial layer 220 may secure light transmissivity of no less than 90%.

The touch array 210 may be disposed on the second sacrificial layer 220 including the inorganic material. The touch array 210 may include a first touch electrode disposed on the second sacrificial layer 220, a first insulating layer disposed on the first touch electrode, a second touch electrode disposed on the first insulating layer, and a second insulating layer disposed on the second touch electrode.

Figure 9:
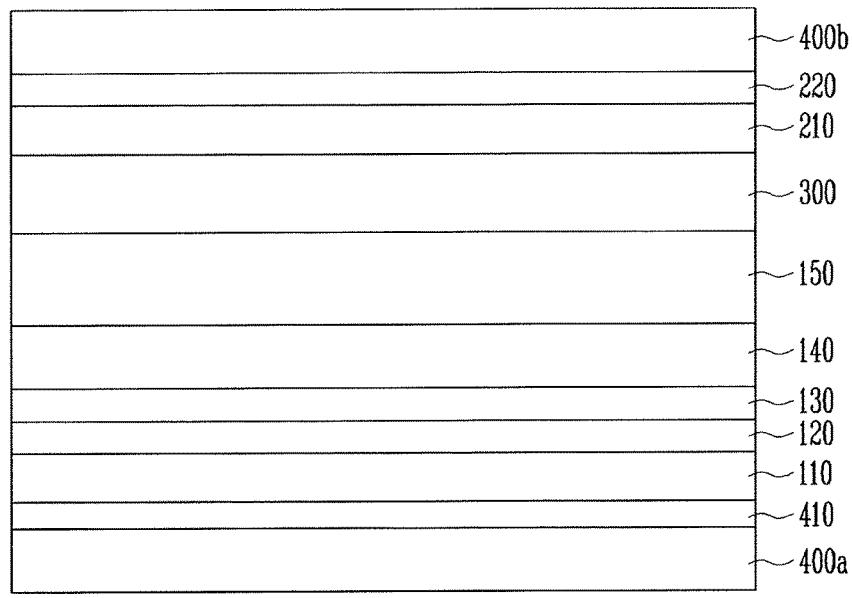

Referring to FIG. 9, the first supporting substrate 400a may be adhered to the second supporting substrate 400b through the adhesive 300 such that the first supporting substrate and the second supporting substrate face each other. Here, the adhesive 300 may include an adhesive material hardened by heat.

Figure 10:
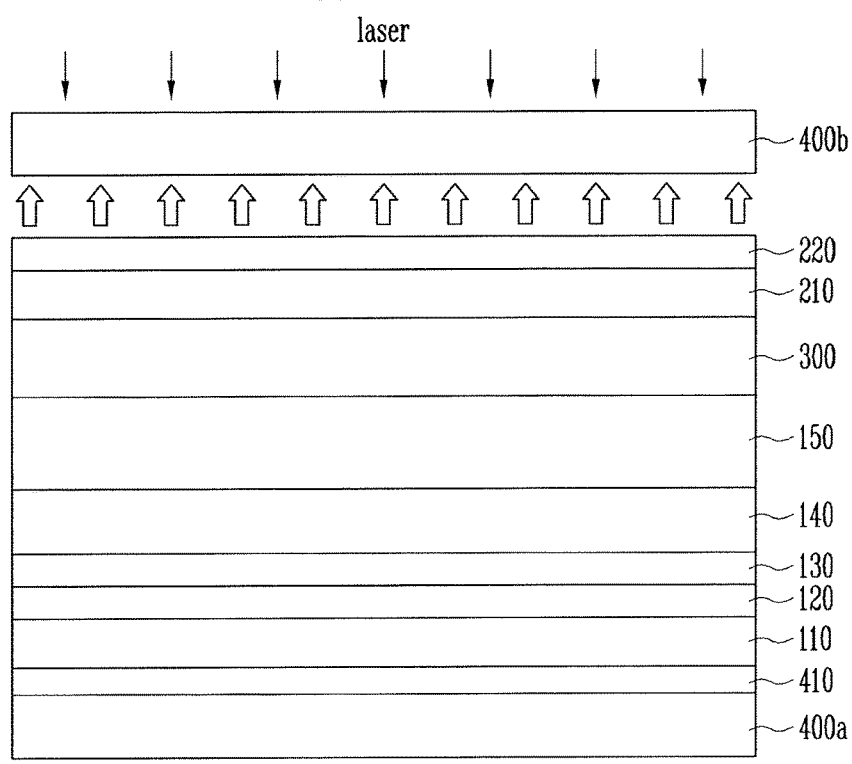

Referring to FIG. 10, the second supporting substrate 400b and the second sacrificial layer 220 may be separated from each other at an interface by the LLO process. When laser energy is irradiated onto the second supporting substrate 400b, when the energy band gap of the second supporting substrate 400b is larger than a wavelength of the laser, the irradiated laser may easily pass through the second supporting substrate 400b. The second supporting substrate 400b and the second sacrificial layer 220 may be separated by the laser irradiation. Thereafter, the second sacrificial layer 220 may remain on the touch array 210.

The second sacrificial layer 220 that remains on the touch array 210 may help protect the touch array 210 and may help prevent external moisture and oxygen from being received by the touch array 210.

For example, the second sacrificial layer 220 may be formed of a thin film including an inorganic material. Accordingly, it may be possible to secure transparency in comparison with the case in which an organic layer is formed on the supporting substrate and the touch array is formed on the organic layer. It may also be possible to prevent a gas generated by the organic layer from affecting the touch array. In addition, when the second sacrificial layer 220 is formed of the inorganic material, the touch array 210 disposed on the second sacrificial layer 220 may not be affected by surface roughness of the second sacrificial layer 220. Therefore, reliability of the touch array 210 may improve.

Figure 11:
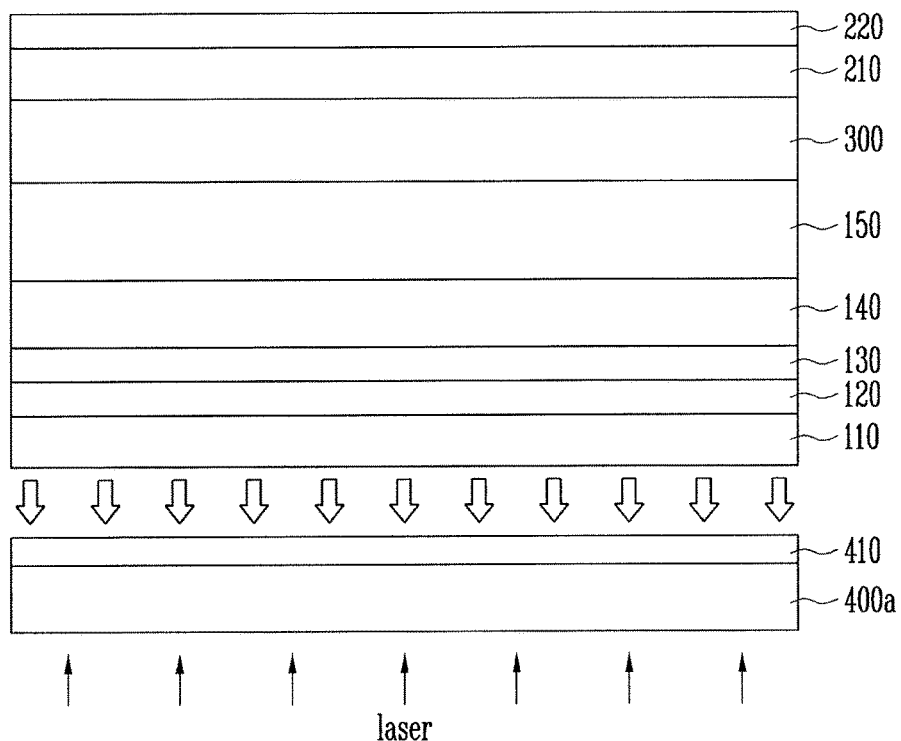

Referring to FIG. 11, laser energy may be irradiated to a rear surface of the first supporting substrate 400a. When the laser is irradiated to the first supporting substrate 400a, the first sacrificial layer 410 may lose adhesion due to the energy of the laser beam such that the first sacrificial layer 410 may be separated from a rear surface of the second barrier layer 110.

Here, as illustrated in the FIG. 11, the stripping process of the first supporting substrate 400a may be performed after the stripping process of the second supporting substrate 400b. In some implementations, the stripping process of the first supporting substrate 400a may be performed before the stripping process of the second supporting substrate 400b.

Figure 12:
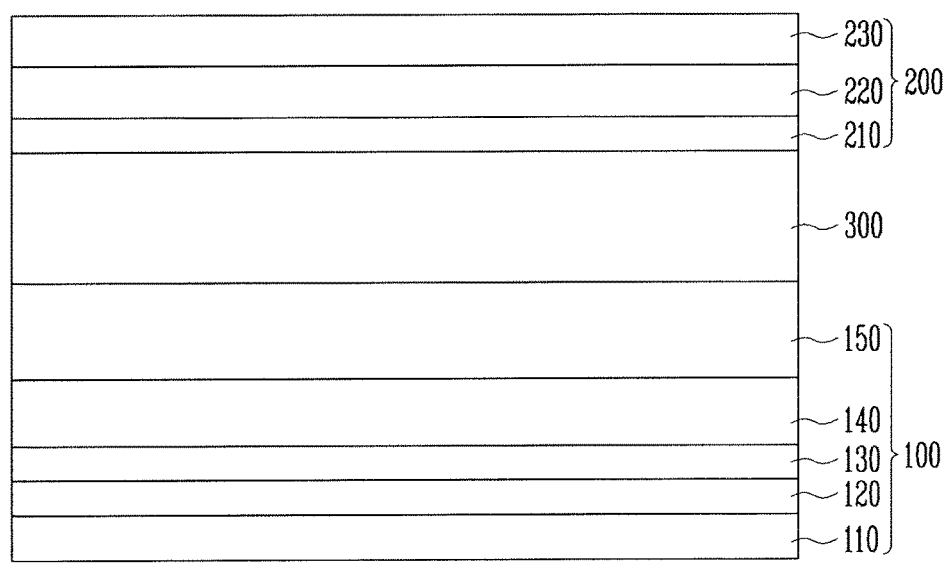

Referring to FIG. 12, after the stripping process of the first supporting substrate (400a of FIG. 11) and the stripping process of the second supporting substrate (400b of FIG. 10) are performed, a protective layer 230 may be disposed on the second sacrificial layer 220.

The protective layer 230 is the same as the third organic layer 230 illustrated in FIG. 2. For convenience sake, since first and second organic layers are not illustrated in FIG. 12, a different term from the third organic layer 230 is used.

The protective layer 230 may be formed of an organic layer and may be coated on the second sacrificial layer 220 by the inkjet method. The protective layer 230 may release internal stress of the second sacrificial layer 220 or may planarize the second sacrificial layer 220.

By way of summation and review, a flexible substrate may be formed of plastic or resin. Plastic or resin is vulnerable to heat. Therefore, there is a risk that the flexible substrate may be transformed by subsequent processes in which structures (for example, a touch array, a thin film transistor (TFT) array, and an organic light emitting diode (OLED), etc.) are formed on the flexible substrate. In order to address this issue, a technology of fixing the flexible substrate to a supporting substrate and then, stripping the flexible substrate from the supporting substrate when processes are completed has been introduced. However, in such a case, there is a risk that a surface of the flexible substrate may be damaged by the stripping process.

A technology of attaching an organic layer onto the supporting substrate and forming structures on the organic layer without directly attaching the flexible substrate to the supporting substrate has been developed. In such a case, a gas is generated by the organic layer while performing processes of manufacturing the structures so that the structures may be affected by the gas and shapes of the structures may be affected by surface roughness of the organic layer.

Embodiments relate to a flexible display device and a method of manufacturing the same.

In the flexible display device manufactured according to embodiments, use of the organic layer is minimized when the touch array is disposed on the supporting substrate, such that it is possible to prevent the gas generated by the organic layer from being received by the touch array. Transparency is secured such that it is possible to improve reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a flexible display device, the method comprising:
    forming a base substrate on a first sacrificial layer formed on a first supporting substrate;
    forming a display device array on the base substrate;
    forming a second sacrificial layer on a second supporting substrate;
    forming a touch array on the second sacrificial layer;
    adhering the first supporting substrate onto the second supporting substrate using an adhesive;
    irradiating laser energy onto the first sacrificial layer to remove the first sacrificial layer and to separate the first supporting substrate from the base substrate; and
    irradiating laser energy onto the second sacrificial layer to separate interfaces of the second supporting substrate and the second sacrificial layer from each other and such that the second sacrificial layer is fixed on the touch array,
    wherein the second sacrificial layer includes at least one selected from the group of oxidized molybdenum ($MoO_3$), lead zirconate titanate (PZT), gallium nitride (GaN), and an amorphous silicon (a-Si) based inorganic material, and
    wherein the first sacrificial layer and the second sacrificial layer include different materials.

2. The method as claimed in claim 1, wherein the second sacrificial layer is formed on the second supporting substrate by an atomic layer deposition (ALD) method or a chemical vapor deposition (CVD) method.

3. The method as claimed in claim 1, wherein a thickness of the second sacrificial layer is 1,000 Å through 3,000 Å.

4. The method as claimed in claim 1, further comprising coating a protective layer onto the second sacrificial layer.

5. The method as claimed in claim 4, wherein coating the protective layer onto the second sacrificial layer is performed by an inkjet method.

6. The method as claimed in claim 1, wherein the base substrate comprises one selected from the group of polyethylene naphthalate (PEN), polyethylene terephthalate (PET), polyethylene etherphthalate, polycarbonate, polyarylate, polyetherimide, polyether sulfonate, polyimide, and polyacrylate.

7. The method as claimed in claim 1, wherein forming the display device array comprises:
    forming a thin film transistor (TFT) on the base substrate;
    forming a first electrode on the TFT;
    forming an organic light emitting layer on the first electrode; and
    forming a second electrode on the organic light emitting layer.

* * * * *